United States Patent [19]
Burgess et al.

[11] Patent Number: 5,137,751
[45] Date of Patent: Aug. 11, 1992

[54] PROCESS FOR MAKING THICK MULTILAYERS OF POLYIMIDE

[75] Inventors: Marvin J. Burgess, Lisle; Douglas E. Fjare; Herbert J. Neuhaus, both of Naperville; Robert T. Roginski, Lisle; David A. Wargowski, Naperville, all of Ill.

[73] Assignee: Amoco Corporation, Chicago, Ill.

[21] Appl. No.: 613,153

[22] Filed: Nov. 13, 1990

Related U.S. Application Data

[63] Continuation-in-part of Ser. No. 491,437, Mar. 9, 1990, abandoned.

[51] Int. Cl.$^5$ .............................. B05D 5/12
[52] U.S. Cl. ................... 427/123; 427/379; 427/404; 427/407.1
[58] Field of Search ............... 427/385.5, 407.1, 372.2, 427/385.5, 412.4, 379, 96, 123, 404; 525/353; 528/176

[56] References Cited

U.S. PATENT DOCUMENTS

| | | | |
|---|---|---|---|
| 3,952,116 | 4/1976 | Trenkler | 427/123 |
| 4,119,758 | 10/1978 | Keating | 428/379 |
| 4,152,195 | 5/1979 | Bährle et al. | 427/380 |
| 4,208,464 | 6/1980 | Ishizuka et al. | 428/377 |
| 4,255,471 | 3/1981 | Boldebuck et al. | 427/385.5 |
| 4,519,941 | 5/1985 | Anderson | 252/514 |
| 4,535,115 | 8/1985 | Bakshi et al. | 524/376 |
| 4,587,203 | 5/1986 | Brault et al. | 430/325 |
| 4,592,944 | 6/1986 | Clark et al. | 428/195 |
| 4,643,910 | 2/1987 | Foutz | 427/8 |
| 4,699,803 | 10/1987 | Araps et al. | 427/96 |
| 4,720,401 | 1/1988 | Ho et al. | 427/123 |
| 4,820,791 | 4/1989 | Hergenrother et al. | 528/125 |
| 4,851,280 | 7/1989 | Gupta | 428/246 |
| 4,874,834 | 10/1989 | Higashi et al. | 528/176 |
| 4,876,329 | 10/1989 | Chiang et al. | 528/353 |
| 4,895,972 | 1/1990 | Stoakley et al. | 528/353 |
| 4,897,153 | 1/1990 | Cole et al. | 156/643 |
| 4,952,669 | 8/1990 | Vora | 528/353 |
| 4,978,594 | 12/1990 | Bruce et al. | 430/14 |
| 4,997,869 | 3/1991 | Eisenbraun et al. | 427/385.5 |
| 5,004,627 | 4/1991 | Presswood et al. | 427/385.5 |

Primary Examiner—Michael Lusignan
Assistant Examiner—Diana L. Dudash
Attorney, Agent, or Firm—Rae K. Stuhlmacher; William H. Magidson; Frank J. Sroka

[57] ABSTRACT

A polyimide layer having a thickness greater than about 5 microns is formed on a substrate by coating a substrate with a solution of polymer and a solvent of the formula

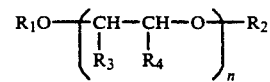

wherein $R_1$ and $R_2$ are independently a hydrogen, a $C_1$ to $C_6$ alkyl moiety, or a

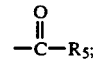

$R_5$ is a $C_1$ to $C_6$ alkyl moiety; and $R_3$ and $R_4$ are independently hydrogen or a $C_1$ to $C_6$ alkyl moiety, and curing the resulting coated substrate.

25 Claims, No Drawings

PROCESS FOR MAKING THICK MULTILAYERS OF POLYIMIDE

RELATED APPLICATION

This application is a Continuation-In-Part of copending U.S. patent application Ser. No. 491,437, filed Mar. 9, 1990, fully incorporated herein by reference, now abandoned.

FIELD OF THE INVENTION

This invention relates to a method to produce layers of polyimide in electronic applications and more particularly relates to a method to make thick (e.g., more than about 5 microns), polyimide layers on a substrate by a selection of solvent carrier and a composition therefore.

BACKGROUND OF THE INVENTION

Polyimides, particularly aromatic polyimides, have found extensive use in microelectronic devices due to their high thermal stability, low dielectric constant and high electrical resistivity. Aromatic polyimides typically are formed by dissolving an aromatic diamine in a compatible solvent and then adding a dianhydride which reacts with the diamine to make a solution of polyamic acid. The resulting solution of polyamic acid can be coated onto a substrate, the solvent evaporated, and the polyamic acid imidized. Conventional solvents for forming the polyamic acid and subsequent imidization include polar aprotic solvents such as N-methyl-pyrrolidinone (NMP).

A multilayer interconnect structure, such as a microelectronic multichip module, consists of alternate layers of a conducting material and a material having a low dielectric constant (an insulating material). In particular, polyimides containing fluorine provide a material with a low dielectric constant and low moisture absorption while maintaining desirable features of polyimides such as excellent thermal stability, high glass transition temperature (Tg), and good solvent resistance.

Typically, thick polyimide layers are formed from a number of thin coats of polyamic acid. Each thin coat is imidized before the next coat is applied. However, fluorinated polyimides are degraded by many conventional polar aprotic solvents, such as NMP. It has been observed that these conventional polar aprotic solvents interact with the polyimide and result in cracking of thick layers of the polyimide.

To eliminate the cracking problem a number of approaches can be taken. One approach would be to select polyimides such that the polyimide has a linear coefficient of thermal expansion that matches that of the substrate. This would minimize the stress present in the polyimide film after curing and can make the polymer less susceptible to cracking or crazing. However, few polyimide structures have the very low linear coefficient of expansion required to match typical substrates. Further, these polyimides may not exhibit the low dielectric constant and low moisture absorption that is desirable in electronic applications.

Another approach is to select an alternative solvent system that is less aggressive toward the polyimide. The alternative solvent must not be so volatile that it will evaporate before the polymer solution can be applied to the substrate. It has been found that solvents having a boiling point greater than abort 150° C. will spread to coat the substrate without undue evaporation. Further, the polymer must be sufficiently soluble in the solvent or solvent system for multilayer processing. In other words, the solvent must be able to keep the polymer solvated during the coating of the substrate. The polymer solution should have relatively stable solution viscosity. Finally, the solvent must not attack the underlying polyimide during the multilayer processing steps.

SUMMARY OF THE INVENTION

A polyimide layer on the substrate having a thickness greater than about 5 microns is formed by a polymer dissolved in a solvent of formula I

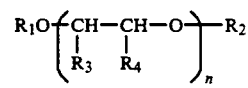

wherein $R_1$ and $R_2$ independently a hydrogen, $C_1$ to $C_6$ alkyl moiety, or

$R_5$ is a $C_1$ to $C_6$ alkyl moiety; and $R_3$ and $R_4$ are independently hydrogen or a $C_1$ to $C_6$ alkyl moiety; and n is from 1 to 4.

The method of the present invention can be applied to the formation of thick layers in many electronic applications, for example passivation or electronic chip coatings, and multilayer applications such as interlayer dielectric or multichip module applications. In addition, the method of the present invention can be applied to cladding material for plastic optical waveguides and fibers, planarization coatings over patterned metal or patterned polymer, and metal lift-off stencils.

A polyimide layer on a substrate can be formed by reacting a diamine and a dianhydride in a solvent of Formula I to form a polyamic acid, coating one or more layers of the polyamic acid solution onto a substrate, and curing the resulting coated substrate to form a polyimide layer having a thickness greater than about 5 microns.

Alternatively, the polyamic acid can be prepared in another solvent, such as NMP. In this case, the solvent can be substantially removed by any means known by those skilled in the art, such as evaporation. The polyamic acid then can be redissolved in the solvent of Formula I. In other words, the practice of the invention is not restricted to only those polyamic acids that are prepared in the solvent of Formula I.

Where the polyimide is soluble in the solvent of Formula I, the polyamic acid can be thermally or chemically imidized and the polyimide can be coated onto the substrate. If the polyamic acid is thermally imidized in the solvent of Formula I, the polyamic acid solution can be used directly. However, if the polyamic acid is chemically imidized the byproducts of the chemical imidization are removed, typically by precipitation of the polyimide from solution, and the polymer is redissolved in the solvent of Formula I.

The solvents of Formula I typically have a boiling point above about 150° C. Many of the solvents of Formula I will solubilize the resulting polyamic acid or polyimide to form polymer solutions having relatively stable solution viscosity. The polymer solutions will not attack the underlying polyimide during the multilayer processing steps. The solvents of Formula I are particularly effective for making thick multilayers of fluorinated polymer, for example, the reaction product of a dianhydride, such as 2,2-bis(3,4-dicarboxyphenyl)hexafluoropropane dianhydride (6FDA), and at least one diamine.

BRIEF DESCRIPTION OF THE INVENTION

The present invention provides a process for forming a thick (greater than about 5 microns) layer of polyimide on a substrate. In this invention a layer of polyimide, particularly a fluorinated polyimide, can be formed by coating a substrate with a precursor polyamic acid and curing the precursor polyamic acid to form the polyimide. The polyamic acid is generally cured at elevated temperatures, typically from about 100° C. to about 500° C., more typically from about 250° C. to about 400° C., to form a cured polyimide layer.

Alternatively, the polyamic acid can be imidized, coated on the substrate, and cured. If the polyamic acid is thermally imidized in the solvent of Formula I, the polyamic acid solution can be used directly. However, if the polyamic acid is chemically imidized the by-products of the chemical imidization are removed, typically by precipitation of the polyimide from solution, and the polymer is redissolved in the solvent of Formula I. The polyimide layer is generally subjected to a final cure to assure completion of the imidization and substantially remove any residual solvent. The final cure is generally at elevated temperatures, typically from about 100° C. to about 500° C., more typically from about 250° C. to about 400° C.

Suitable solvents, according to Formula I, include lower alkyl ether alcohols. Examples are lower alkyl ($C_2$–$C_6$) ether alcohols, for example, 2-(2-ethoxyethoxy)ethanol, 2-(2-methoxyethoxy)ethanol, 2-(2-butoxyethoxy)ethanol and the like.

Suitable solvents, according to Formula I, also include alkyl ethers, such as for example, ethylene glycol dimethyl ether (glyme), ethylene glycol diethyl ether, 2-methoxyethyl ether (diglyme), 2-ethoxyethyl ether, triethylene glycol dimethyl ether (triglyme), tetraethylene glycol dimethyl ether (tetraglyme), propylene glycol dimethyl ether, dipropylene glycol dimethyl ether and the like. Suitable solvents also include mixed ethers, such as ethylene glycol ethyl methyl ether, tetraethylene glycol ethyl methyl ether, and the like.

Additional suitable solvents according to Formula I include those solvents where $R_1$ and $R_2$ are acetate, propionate, or butanoate. For example, propylene glycol methyl ether acetate, 2-ethoxyethyl acetate, 2-(2-ethoxyethoxy)ethyl acetate and the like.

Further, a cosolvent system can be prepared where two or more solvents of Formula I are present. For example, an 2-(ethoxyethoxy)ethanol/diglyme cosolvent system (see Example 6).

The solvent systems of the present invention can also contain a small amount of a polar aprotic solvent, such as NMP (for example, see Example 5).

Generally, polymers included in the present invention include polyimides and polyamic acids. The polyimides have recurring units of Formula II

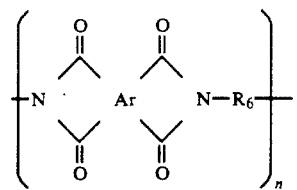

wherein Ar is at least one tetravalent aromatic nucleus; $R_6$ is a divalent hydrocarbon moiety which can be an aromatic or an aliphatic moiety or an amine-terminated poly(dialkylsiloxane) moiety; and n is an integer representing the number of repeating units to provide a molecular weight usually of about 1,000 to about 100,000 daltons. Ar and $R_6$ can be substituted or unsubstituted, for example, with an alkyl group of 1 to 4 carbon atoms or halogen.

The polyamic acids include recurring units of Formula

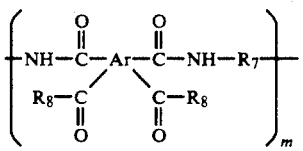

wherein Ar is defined above; $R_7$ is a divalent hydrocarbon moiety which can be an aromatic or aliphatic moiety or an amine-terminated poly(dialkylsiloxane) moiety; $R_8$ is independently selected from halogen, —OH, and —$OR_9$; $R_9$ is an alkyl group of 1 to 4 carbon atoms or halogen; and m is an integer representing the number of repeating units to provide a molecular weight usually of about 1,000 to about 100,000 daltons. $R_7$, $R_8$ and $R_9$ can be substituted or unsubstituted, for example, with an alkyl group of 1 to 4 carbon atoms or halogen.

In greater detail, the aromatic moieties, Ar in Formulas II and III, are individually characterized by a single aromatic ring or by two or more such rings which are fused together or are joined by one or more stable linkages, such as a covalent carbon-carbon bond, oxy, sulfonyl, carbonyl, alkylene, and the like. The aromatic moiety, Ar, can include divalent moieties of benzene, naphthalene, phenanthrene, anthracene, and the like. Further, the aromatic rings can be unsubstituted or substituted, for example, with one or more lower alkyl groups or halogen.

Specific examples of suitable Ar moieties include

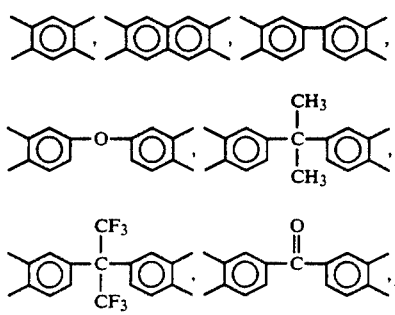

-continued

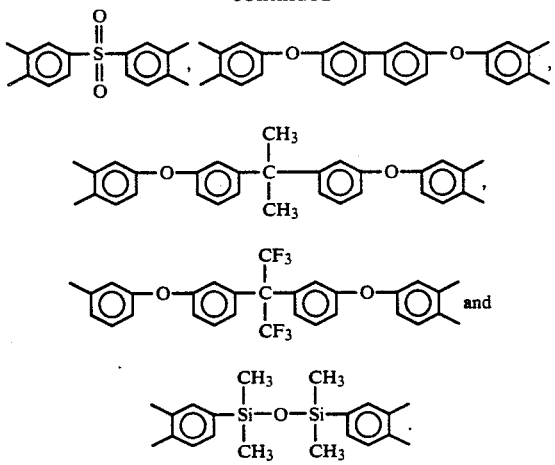

The divalent hydrocarbon moieties, $R_6$ and $R_7$ in Formulas II and III, are individually selected from an aliphatic or an aromatic moiety. The aliphatic moiety is characterized by a straight or branched-chain hydrocarbon, such as, for example, methylene, ethylene, propylene, tetramethylene, hexamethylene, octamethylene, nonamethylene, decamethylene, dodecamettylene, and the like, which can be unsubstituted or substituted with one or more halide such as fluorine, siloxane such as aminopropylterminated polydimethylsiloxane, or lower alkyl groups such as for example, 2,2,4-trimethylhexamethylene, 2,2-dimethylpropylene, and the like. The aromatic moiety is characterized by a single aromatic ring or by two or more such rings which are fused together or are joined by one or more stable linkages, such as a covalent carbon-carbon bond, oxy, sulfonyl, carbonyl, alkylene, and the like. The aromatic moiety can include tetravalent moieties of benzene, naphthalene, phenanthrene, anthracene, and the like. Further, the aromatic rings can be unsubstituted or substituted, for example, with one or more halide or lower alkyl groups.

The polyamic acid precursors typically are made from aromatic dianhydrides, including their ester and acid forms, and at least one aromatic diamine. Suitable diamines include 2,2-bis(4-(p-aminophenoxy)phenyl)-hexafluoropropane (BDAF), 3,5-diamino-t-butylbenzene (DATB), 3,5-diaminobenzotrifluoride (DABF), 4,4'-bis(p-aminophenoxy)biphenyl (APBP), 2,2-bis(4-aminophenyl)propane (BAA), 2,2-bis(4-aminophenyl)-hexafluoropropane (BAAF), 4,4'-bis(4-amino-2-trifluoromethylphenoxy)biphenyl (FAPB), m-phenylenediamine (MPDA), p-phenylenediamine (PPDA), 4,4'-diaminodiphenylether (OBA), 2,2-bis [4-(p-aminophenoxy)phenyl]propane (BAPP), 4,4'-[1,4-phenylenebis(1-methylethylidene)]bisaniline (BAP), 3',5-diamino-1,3,3,6'-tetramethyl-1-(4'-tolyl)indan (DATI), and the like.

Suitable dianhydrides include the dianhydrides of benzene, naphthalene, biphenyl (BPDA), diphenylether, benzophenone (BTDA), pyromellitic dianhydride (PMDA), bis-(3,4-dicarboxyphenyl)etter dianhydride (OPAN), bis(3,4-carboxyphenyl)sulfone dianhydride (SPAN), 2,2-bis(3,4-dicarboxyphenyl)propane dianhydride (IPAN), 2,2-bis(3,4-dicarboxyphenyl)hexafluoropropane dianhydride (6FDA), 1,3-bis(3,4-dicarboxyphenyl)tetramethyldisiloxane dianhydride (PADS), and the like.

The polyamic acid is typically prepared as the condensation product of one or more diamines and one or more dianhydrides to form homopolymers or copolymers. Copolymers can contain any amount of additional anhydrides or diamines. The total diamine and total dianhydride components are typically present in a ratio of approximately 1:1. However, by using an excess of diamine or dianhydride in the reaction mixture (typically ranging from about 0.9:1 to about 1.1:1), the chain length of the product can be adjusted. Further, the chain length can be restricted by adding a predetermined quantity of a monoamine or a monocarboxylic acid anhydride to the reaction mixture.

In the practice of the present invention, the polyamic acid can be prepared, and the polyimide layer can be formed, in the solvent of Formula I. Alternatively, the polyamic acid can be prepared in a conventional solvent, for example NMP. The conventional solvent can be substantially removed, for example by evaporation, and the polyamic acid can be redissolved in the solvent of Formula I.

In greater detail, a solution of polyamic acid is prepared by reacting a diamine such as APBP stoichiometrically with a dianhydride such as 6FDA in a suitable solvent, which can be a solvent according to Formula I or a conventional solvent, such as NMP. The reaction generally takes place at from about minus 10° C. to about 100° C. If a conventional solvent such as NMP is used, the conventional solvent is substantially removed by any means known to those skilled in the art, such as evaporation. Thereafter, the polyamic acid is redissolved in a solvent of Formula I.

Alternatively, the polyamic acid can be imidized, coated on the substrate as a polyimide, and cured. If the polyamic acid is thermally imidized in the solvent of Formula I, the polyamic acid solution can be used directly. However, if the polyamic acid is chemically imidized the byproducts of the chemical imidization are removed, typically by precipitation of the polyimide from solution, and the polymer is redissolved in the solvent of Formula I.

Chemical imidization is generally accomplished using dehydrating agents, such as, for example, acetic anhydride or trifluoro-acetic anhydride. Other examples of suitable dehydrating agents can be found in Bessonov, M.I. et al., Polyimides—Thermally Stable Polymers, Consultants Bureau, N.Y., 76-82 (1987), incorporated herein by reference. A particularly suitable chemical imidization composition is the dehydrating agent, acetic anhydride, used in the presence of a catalyst such as pyridine or triethylamine. Also preferred are 1,3-dicyclohexylcarbodiimide (DCC), thionyl chloride, phosphorous trichloride, trifluoroacetic anhydride, and the like.

The polyimide layer is generally subjected to a final cure to assure completion of the imidization and substantially remove any residual solvent. The final cure is generally at elevated temperatures, typically from about 100° C. to about 500° C., more typically from about 250° C. to about 400° C.

The solution of polyamic acid or polyimide in a solvent of Formula I is spin-coated onto a substrate, such as a silicon wafer, and cured, typically at elevated temperatures. Curing the polymer will imidize the polymer and substantially remove the solvent. The cure temperature typically ranges from about 100 C to about 500° C., more typically from about 250° C. to about 400° C. The polyimide layer can be more than 5 microns and preferably is about 10 to 30 microns thick. The curing cycle can be ramped by increasing the curing temperature in stages from about one hour to about 8 hours.

One or more polyimide layers can be deposited on the substrate to form the thick layer. However, each layer of polymer is typically partially cured before adding the next layer of polymer. Otherwise, the solvent from the later applied polymer solution could wash away the uncured first layer of polymer.

In general, the solution of polyamic acid or polyimide is diluted before it is spread on the substrate. The degree of dilution of the solution of polyamic acid or polyimide is based on the thickness requirement of the final coating, the viscosity and solids content of the solution, and the spin curve data for the polymer. Solutions of the polyamic acid or polyimide generally range from about 5 to about 50 weight percent, preferably, from about 10 to about 40 weight percent, depending upon the molecular weight, to provide the proper viscosity for application to the substrate by spin coating.

The spin curve data can be obtained by spin-coating the polymer onto the substrate at various spin speeds, curing the polymer, measuring the resulting thickness, and plotting thickness versus spin speed. The diluted solution is generally filtered before further processing.

The polymer solution can be applied either statically or dynamically. In static application, the polymer solution is dispensed to a nonrotating substrate and spread across the surface by spinning. In dynamic application, the polymer solution is dispensed to a rotating substrate. In either case, the substrate is spun at a spin speed which is determined from the spin curve for the final coating thickness required.

Alternatively, the polymer can be applied to suitable carriers, or substrates, by other conventional methods, which can include, but are not necessarily limited to, dipping, brushing, casting with a bar, roller-coating, spray-coating, dip-coating, whirler-coating, cascade-coating, curtain-coating, or other methods.

Examples of suitable carriers, or substrates, are plastics, metal and metal alloys, semi-metals, semiconductors, such as Si, Ge, GaAs, glass, ceramics and other inorganic materials, for example, $SiO_2$ and $Si_3N_4$. Further, the substrate can be dried (dehydration) to remove moisture on the surface of the substrate before the application of the polymer.

If desired, an adhesion promoter can be used to secure the polymer to the substrate. Adhesion promoters are well known and are commercially available. A suitable adhesion promoter is 3-aminopropyltriethoxysilane (APES) which is available from Aldrich.

Alternatively, a minor amount of amine-terminated siloxane moiety can be incorporated into the polymer to improve the adhesion of the polymer to the substrate. In this case, less than about 10 weight percent amineterminated siloxane moiety can be added so long as the thermal properties of the polymer are not severely affected. Suitable amine-terminated siloxane moieties are typically derived from siloxane-containing diamines having from 1 to about 40 disubstituted siloxyl units. Suitable siloxane diamines include bis-aminopropyl polydimethylsiloxane, bisaminopropyl polydiethylsiloxane, bis-aminopropyl polydipropylsiloxane, diphenyl siloxanes, and the like.

Conventional methods for etching the polymer coating include dry etching and wet etching. Dry etching can include lasar drilling (lasar ablation) or the use of gaseous plasmas of oxygen or oxygen/carbon fluoride containing mixtures which are exposed to a polyimide.

Polymer wet-etching processes differ depending on the state of cure (or imidization) of the polyimide. Fully or substantially fully cured polyimides can be etched using either hydrazine hydrate or ethylene diamine. Wet etching of partially cured polyamic acid films can include the use of basic solutions, for example, aqueous solutions of either tetramethylammonium hydroxide or sodium hydroxide. Alternatively, wet etching can include the use of the non-ionic base wet-etch solutions that are described and claimed in application Ser. No. 605,555, filed on Oct. 30, 1990, fully incorporated herein by reference. For example, a 6FDA/APBP polyamic acid can be etched with an aqueous solution of a non-ionic base such as triethanolamine (TEA), and a substituted hydrocarbon solvent such as methanol, wherein a major portion of the solution is water and less than 1 weight percent of the total composition of the solution is an ionic base such as tetramethylammonium hydroxide (TMAH).

Typically, in a wet-etching process, the polymer is coated on the substrate and soft baked to remove solvent. The polymer-coated substrate is then coated with the positive photoresist material (for example, a commercially available, light sensitive polymer is available from Hoechst AG under the tradename AZ 1350J ®), and the coated substrate is heated at an elevated temperature (from about 75° C. to about 150° C.) to remove the solvents from the photoresist material.

The photoresist material is then covered with a mask containing a pattern of windows (openings through the photoresist material) which are positioned where vias (openings through the polymer) are desired in the polymer coating. The photoresist material is thereafter exposed to actinic radiation (such as UV light) to convert the photoresist material by photochemical reaction from an insoluble material to one that is soluble in basic aqueous developer solvents. Thus, photoresist material can be selectively removed to form windows that uncover the polymer coating.

The exposed photoresist material is typically developed (or dissolved and removed), for example, by an aqueous solution consisting essentially of tetramethylammonium hydroxide (TMAH), which is commercially available under the trademark Shipley ® 312. The developer solution forms water soluble salts with the exposed photoresist material and effectively allows the exposed photoresist material to be washed away. The unexposed photoresist material is not soluble in the aqueous base; therefore, the polymer material that is underneath the unexposed photoresist material is protected from the aqueous base by the layer of unexposed photoresist material.

The polymer can now be selectively etched through the windows in the photoresist material. For a coating application, this requires etching vias (or openings) through the polymer coatings to permit access for electrical connections between the conductor layers and the outside environment. In the case of a multilayer interconnect structure, access is required for connections between conductor layers or between the conductor layers and the outside environment. These openings are typically 15 to 500 microns but can be as small as 1 micron.

The polymer coating which had been located under the exposed photoresist material is now uncovered and can be etched with the wet-etch composition. The wet-etch composition is generally maintained at a temperature of from about 0° C. to about 60° C.

There are generally at least two wet-etch application procedures for etching a coated substrate or layered module; dip-etching and spray-etching. In dip-etching, the coated substrate or layered module is dipped into a container of the wet-etch composition, and the polymer is allowed to dissolve. The polymer effectively dissolves as an infinite dilution. In spray-etching, a mist of etchant is applied to the surface of a rotating substrate or module. In this manner, fresh etchant is continually delivered to the surface, and dissolved polymer is continually being spun off. A particular etchant can behave differently in the dip-etch and spray-etch method. Also, mechanical agitation will affect the outcome of the dip-etch application procedure.

Depending on the state of cure of the polymer the cure can be completed, typically by thermal means. Thermal imidization is typically carried out at a temperature range from about 100° C. to about 500° C., more typically from about 250° C. to about 400° C.

The process of the present invention can also be used to produce multilayer interconnect structures. Multilayer interconnects can perform many different functions in the microelectronic field. For example, the interconnects can conduct electric power or signals within an integrated circuit or between multiple integrated circuit chips. Vias (or openings) are required through the polyimide layers to permit access for electrical connections between the conductor layers or between the conductor layers and the outside environment.

Processing multilayer interconnect structures, such as multilayer chip devices, requires a multistep procedure. As described above, polyamic acids are typically made by dissolving a dianhydride and a diamine in a solvent, which can be a conventional solvent or the solvent of Formula I. If a conventional solvent is used, then that solvent is substantially removed, and the polyamic acid is redissolved in the solvent of Formula I. The resulting solution of polyamic acid is spread on a substrate to form a coating. The polyamic acid is cured, generally by heating (typically from about 100° C. to about 500° C., more typically from about 250° C. to about 400° C.) to form a polyimide layer.

Alternatively, the polyamic acid can be imidized to form the polyimide. When the polyamic acid is chemically imidized as described above, the polymer is isolated (precipitated) to remove the byproducts of the imidization and redissolved in the solvent of Formula I. When the polyamic acid is thermally imidized in the solvent of Formula I, the polyimide solution can be used to coat the substrate. The polyimide is typically subjected to a final cure to assure completion of the imidization and substantially remove any solvent residue.

In a multilayer device, the polyimide can be formed on various substrates which can be any material that is not decomposed in the high temperatures that are required for multilayer processing. For example, suitable substrates include silicon, metals (such as aluminum, copper, and the like), ceramic, glass, and polymeric materials.

A conductor layer is applied. The surface of the underlying polyimide can be plasma etched or reactive ion etched in a plasma before the application of the conducting material to enhance the adhesion between the polymer and the conducting material.

The layer of conducting material can be placed onto the coated substrate by standard techniques, such as electroplating, sputtering, evaporation, and the like. For example, aluminum can be deposited by E-beam evaporation and patterned using microlithography and a mask. Additional coats of polyimide can be deposited to form a multilayer structure. Typically, the conducing material is applied with a sputtering machine (such as the sputtering machine sold by CVC Products).

The conducting material is typically etched to form a pattern. Etching is generally accomplished by coating the conducting material with a photoresist material which is in a solvent and that solvent is removed, typically by heating (also called soft baking). The photoresist material is then shielded with a mask containing a pattern of openings and the photoresist material is exposed to actinic radiation, such as UV light. Thus, the photoresist material is photochemically altered such that the areas that were exposed to actinic radiation are soluble and windows are created by taking advantage of this selective solubility to develop and remove specific areas of photoresist material. The conducting material is etched through the windows in the photoresist material, generally by contacting the conducting material with a etchant that is specific for that material. For example, aluminum can be plasma etched, reactive ion etched, or etched with an aqueous solution of phosphoric acid, acetic acid, and nitric acid. Aluminum etchants are commercially available, for example, from KTI, Sunnyvale, Calif. Thereafter, a second layer of polymer can be applied and cured. This process is repeated to form a multilayer structure having the desired number of layers. Typically, the multilayer structure will have 4 to 6 layers of conducting material, but the structure can have many more layers.

When vias are required in the polyimide layer, the process is similar to the etching process described above. The polymer coating is further coated with a photoresist material (for example Shipley 1813) which itself is in a solvent, and that solvent is removed, typically by heating (also called soft baking). The photoresist material is then shielded with a mask containing a pattern of openings, and the photoresist material is exposed to actinic radiation. Thus, the photoresist material is photochemically altered such that the areas that were exposed to actinic radiation are soluble, and windows are created by taking advantage of this selective solubility to develop and remove specific areas of photoresist material. Photoresist developers are generally basic aqueous solutions, for example tetramethylammonium hydroxide or sodium hydroxide (commercially available as Shipley 351 and 312, respectively). The polymer coating can then be etched either along with the development and removal of the photoresist material or through the windows created in the photoresist material. After the polymer is etched, the unexposed photoresist is removed, and the remaining polymer can be cured, generally by heating, typically from about 100° C. to about 500° C., more typically from about 250 C to about 400° C., to form the polyimide coating. Thereafter, layers of conducting material and additional polyimide can be applied as described above.

Other customary additives which do not have an adverse influence on the thick layer process can be incorporated in the coating during preparation of the coating composition. Examples of these additives are delustering agents, flow control agents, fine-particled fillers, flameproofing agents, fluorescent brighteners, antioxidants, light stabilizers, stabilizers, dyes, pigments, adhesion promoters, and antihalo dyes.

The following examples will serve to illustrate certain embodiments of the herein disclosed invention. These examples should not, however, be construed as limiting the scope of the invention as there are many variations which can be made thereon without departing from the spirit of the disclosed invention, as those of skill in the art will recognize.

EXAMPLES

All percents used are weight percents.

Solution viscosity was determined using a Brookfield Viscometer as described in ASTM D789-86 and is reported in centipoise units (cP).

Inherent Viscosity (IV) was determined at approximately 0.5 g/dl in NMP at 25° C. as described in ASTM D2857.

6FDA is commercially available from Hoechst, R.I. APBP is commercially available from Kennedy & Klim, Inc., Little Silver, N.J.

COMPARATIVE EXAMPLE A

6FDA/APBP in NMP

A solution of polyamic acid was prepared at room temperature in which was added 240.81 grams of 4,4'-bis(p -aminophenoxy)biphenyl (APBP), and 3,480 grams of N -methylpyrrolidinone (NMP). To the mixture was then added 279.19 grams of solid 2,2-bis(3,4-dicarboxyphenyl)hexafluoropropane dianhydride (6FDA) with good mixing. The resulting polyamic acid was adjusted by the addition of 3.92 grams of 6FDA and 392 grams of NMP to achieve a desired solution viscosity of approximately 2,310 cP.

The solution was used to produce a multilayered structure consisting of two levels of polyimide (about 2 microns for each polymer layer) and one layer of aluminum.

An adhesion promoter (3-aminopropyltriethoxysilane, APES, commercially available from Aldrich) was statically dispensed to silicon wafers, and the wafers were spun (5 sec at about 500 rpm, then 30 sec at about 4000 rpm) to form an essentially monomolecular layer of adhesion promoter. Polyamic acid solution (about 12 weight percent solids content) was dispensed onto the adhesion promoter covered silicon wafers (statically dispensed) and the wafers were spun (30 sec at about 500 rpm, then 60 sec at about 3,000 rpm) to form an essentially uniform polymer layer. The polyamic acid was then heated in a nitrogen atmosphere (60 min at 200° C., then 60 min at 400° C.) to imidize the polymer.

An aluminum layer (about 1 micron) was deposited on the polyimide layer with a CVC sputtering machine. The aluminum layer was coated with a positive photoresist material (Shipley 1813), and the wafers were spun (4 sec at about 500 rpm, then 25 sec at about 4,000 rpm) to form an essentially uniform photoresist layer. The photoresist was heated (soft baked) to drive off the solvent (25 min at 95° C. in air). Thereafter, the photoresist material was exposed to broad band UV light (4 sec, 15 mW/cm[2,] measured at 365 nm). The exposed photoresist material was developed and removed with a sodium hydroxide/water developer (commercially available as Shipley 351).

The aluminum was etched to form a patterned aluminum layer using an aluminum etch solution sold by KTI (2 min at approximately 40° C.). The photoresist material that still remained on the aluminum was then exposed to UV light, developed, and removed (Shipley 351).

A second layer of polyamic acid was applied over the patterned aluminum layer using the same technique described for the first layer of polyamic acid. After curing, no polymer cracking was observed.

This example demonstrates that a layer of polyimide of less than 5 microns in thickness, prepared using a conventional solvent, can be multilayered without cracking.

Comparative Example B

6FDA/APBP in NMP

A solution of polyamic acid was prepared at room temperature in which 45.30 grams of 4,4,'-bis(p -aminophenoxy)biphenyl (APBP) and 54.71 grams of 2,2-bis(3,4-dicarboxyphenyl)hexafluoropropane dianhydride (6FDA) and 400 grams of N-methylpyrrolidinone (NMP) were added together with good mixing. The solution was later diluted with an additional 67 grams of NMP to achieve a desired solution viscosity of approximately 21,000 cP.

A multilayered structure having two levels of polyimide (about 10 microns for each polymer layer) and one layer of aluminum (about 2.0–2.5 microns) was prepared as described in Comparative Example A.

Application of the second polymer layer produced cracking in the first layer.

This Example demonstrates that a thick layer polyimide prepared using a conventional solvent shows cracking in multilayer applications.

EXAMPLE 1

6FDA/APBP in 2-(2-Ethoxyethoxy)ethanol

A solution of polyamic acid was prepared at 25° C. in which was added 367.59 grams of 4,4'-bis(p -aminophenoxy)biphenyl (APBP), and 3,200 grams of 2-(2-ethoxyethoxy)ethanol. To the APBP slurry was then added 432.41 grams of solid 2,2-bis(3,4-dicarboxyphenyl)hexafluoropropane dianhydride (6FDA) with good mixing. The solution viscosity was then measured to be 38,300 cP.

A multilayered structure having two levels of polyimide (about 10 microns for each polymer layer) and one layer of aluminum (about 2.0–2.5 microns) was prepared as described in Comparative Example A.

After curing, no cracking in the underlying polymer layer was observed.

In order to examine the stability of the polyamic acid solution, samples of EXAMPLE 1 were refrigerated at from about zero to about 5° C. for approximately a five-week period. The Brookfield viscosity was measured weekly. The viscosity was found to remain relatively stable over this period of time, from approximately 32,000 cP to approximately 30,400 cP. However, when samples of Example 1 were stored at ambient temperature, the Brookfield viscosity was found to decrease.

EXAMPLE 2

6FDA/APBP in Diglyme

A solution of polyamic acid was prepared at 15° C. in which were added 57.57 grams of 4,4,'-bis(p-aminophenoxy biphenyl (APBP), and 610 grams of diglyme. To the APBP solution was then added 67.39 grams of solid 2,2-bis(3,4-dicarboxyphenyl)hexafluoropropane dianhydride (6FDA) with good mixing. The solution viscosity was then measured to be 17,900 cP.

A multilayered structure having two levels of polyimide (each about 10 microns thick) and one layer of aluminum (about 2.0-2.5 microns) was prepared as described in Comparative Example A.

After curing, no cracking was observed in the underlying polymer layer.

The stability of the polyamic acid solution of Example 2 was determined at ambient (room) temperature over a 24-day period. The Brookfield viscosity was measured as reported in Table I below. The viscosity was found to remain relatively stable over this period of time, from approximately 34,500 cP to approximately 35,500 cP.

TABLE I

| AMBIENT TEMPERATURE 6FDA/APBP in Diglyme | |
|---|---|
| DAY NUMBER | cP* |
| 1 | 34,400 |
| 5 | 34,400 |
| 8 | 34,600 |
| 12 | 35,400 |
| 16 | 35,600 |
| 24 | 35,600 |

*centipoise

EXAMPLE 3

6FDA/APBP in Diglyme

A solution of polyamic acid was prepared at 15° C. in which were added 371.60 grams of 4,4,'-bis(p-aminophenoxy biphenyl (APBP), and 3,690 grams of diglyme. To the APBP solution was then added 438.40 grams of solid 2,2-bis(3,4-dicarboxyphenyl)hexafluoropropane dianhydride (6FDA) and 2.25 grams of water with good mixing. The sample was refrigerated at from about zero to about 5° C. and the Brookfield viscosity was measured as reported in Tables II and III below. In Table II, the sample was refrigerated in the reactor vessel. In Table III, the sample from Table II was brought to room temperature, filtered, and rerefrigerated. The viscosity was found to remain relatively stable over this period of time.

TABLE II

| Refrigerated 6FDA/APBP in Diglyme | |
|---|---|
| DAY NUMBER | cP* |
| 1 | 17,600 |
| 4 | 20,000 |
| 7 | 20,500 |
| 8 | 20,500 |

*centipoise

TABLE III

| Refrigerated 6FDA/APBP in Diglyme | |
|---|---|
| DAY NUMBER | cP* |
| 1 | 23,000 |
| 8 | 24,000 |
| 11 | 25,600 |
| 17 | 25,200 |
| 19 | 25,200 |

*centipoise

EXAMPLE 4

6FDA/APBP in Diglyme/NMP

A polyamic acid was prepared according to the procedure described in Example 2. In addition, 4.6 grams of NMP was added to achieve a weight ratio of 95 weight percent diglyme/5 weight percent NMP. The solution viscosity was measured to be 19,500 cP.

The solution was used to prepare a multilayered structure having two levels of polyimide (each about 10 microns thick) and one layer of aluminum (about 2.0-2.5 microns) as described in Comparative Example A.

After curing, no cracking in the underlying polymer layer was observed.

COMPARATIVE EXAMPLE C

Comparative Example C was prepared as described in Example 4 above using 82.14 grams of diglyme and 35.21 grams of NMP to achieve a ratio of 70 weight percent diglyme/30 weight percent NMP. To this solution was added 500 ppm of water. The solution viscosity was measured to be approximately 30,000 cP.

The solution was used to prepare a multilayered structure having two levels of polyimide (each about 10 microns thick) and one layer of aluminum (about 2.0-2.5 microns) as described in Comparative Example A.

Application of the second polymer layer produced cracking in the first layer after curing.

From Example 4 and Comparative Example C, it can be seen that a small amount of NMP can be present in the solvent composition without adversely effecting the ability to prepare thick layers of polyimide according to the method of the present invention. However, when the NMP concentration is increased (for example, to 30 weight percent NMP), the polymer layer exhibits cracking.

EXAMPLE 5

6FDA/APBP in Diglyme/2-(2-Ethoxyethoxy)ethanol

A solution of polyamic acid was prepared at ambient temperature in which were added 20.40 grams of 4,4,'-bis(p -aminophenoxy biphenyl (A?BP), 112.94 grams of diglyme and 112.52 grams of 2-(2-ethoxyethoxy)ethanol. To the APBP solution was then added 24.60 grams of 2,2-bis(3,4-dicarboxyphenyl)hexafluoropropane dianhydride (6FDA) with good mixing. The solution viscosity was then measured to be 16,000 cP.

The solution was used to prepare a multilayered structure having two levels of polyimide (each about 10 microns thick) and one layer of aluminum (about 2.0 - 2.5 microns) as described in Comparative Example A.

After curing, no cracking in the underlying polymer layer was observed.

Samples of Example 5 were refrigerated at from about zero to about 5° C. for a period of 75 days. The Brookfield viscosity was measured as shown in Table IV below. The viscosity was found to remain relatively stable over this period of time, from approximately 16,000 cP to approximately 16,400 cP.

TABLE IV

| 6FDA/APBP in Diglyme/2-(2-Ethoxyethoxy)ethanol | |
|---|---|
| DAY NUMBER | cP* |
| 1 | 16,000 |
| 6 | 16,000 |
| 29 | 16,400 |
| 75 | 16,400 |

*centipoise

EXAMPLE 6

6FDA/APBP Polyimide Redissolved in Diglyme

A solution of polyamic acid was prepared in which were added 45.96 grams of 4,4,'-bis(p-aminophenoxy biphenyl (APBP) and 404.2 grams of NMP. To the APBP solution was then added 54.09 grams of 2,2-bis(3,4-dicarboxyphenyl)hexafluoropropane dianhydride (6FDA) with good mixing to form a polyamic acid (IV 0.83 dl/g). The polyamic acid was imidized by adding 26.90 grams of acetic anhydride and 26.66 grams of triethylamine to the polyamic acid solution. The polyimide was precipitated with water in a Waring blender, filtered and washed with water, and dried for four days in a vacuum oven at 120° C. with a nitrogen purge. The IV of the polyamic acid precipitate was 0.77 dl/g.

Polyimide (3.35 grams) was dissolved into 13.5 grams of diglyme to form a 20 weight percent solids solution. The IV was 0.77 dl/g and the solution viscosity was 9,760 cP.

A multilayered structure having two levels of polyimide (each about 10 microns thick) and one layer of aluminum (about 2.0–2.5 microns) was prepared as described in Comparative Example A.

After curing, no cracking was observed in the underlying polymer layer.

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

That which is claimed is:

1. A method of coating a substrate which comprises:
   (a) applying a first layer of polyamic acid to the substrate;
   (b) partially imidizing the first layer of polyamic acid to provide a first polyimide layer;
   (c) applying a layer of polyamic acid over the first layer of polyimide wherein the polyamic acid is in a solvent of the formula

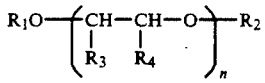

wherein $R_1$ and $R_2$ are independently a hydrogen, a $C_1$ to $C_6$ alkyl moiety, or a

$R_5$ is a $C_1$ to $C_6$ alkyl moiety; and $R_3$ and $R_4$ are independently hydrogen or a $C_1$ to $C_6$ alkyl moiety; and n is from 1 to 4 ; and
   (d) imidizing the polyamic acid.

2. The method of claim 1 wherein the solvent comprises a lower alkyl ether alcohol.

3. The method of claim 2 wherein the solvent comprises 2-(2-ethoxyethoxy)ethanol.

4. The method of claim 1 wherein the solvent comprises an ether.

5. The method of claim 4 wherein the solvent comprises 2-methoxyethyl ether.

6. The method of claim 1 wherein the polyimide comprises a fluorinated polymer.

7. The method of claim 6 wherein the fluorinated polymer comprises the reaction product of 2,2-bis(3,4-dicarboxyphenyl)hexafluoropropane dianhydride and at least one diamine.

8. The method of claim 1 wherein steps (a) to (d) are repeated to provide successive layers of polyimide on the substrate.

9. A method of preventing cracking in an underlying polyimide layer on a substrate when additional layers of polyamic acid are applied to the underlying polyimide layer which comprises:
   (a) applying a first layer of polyamic acid to the substrate;
   (b) partially imidizing the first layer of polyamic acid to provide a first polyimide layer; and
   (c) applying a layer of polyamic acid over the first layer of polyimide wherein the polyamic acid is in a solvent of the formula

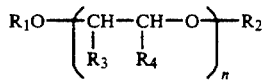

wherein $R_1$ and $R_2$ are independently a hydrogen, a $C_1$ to $C_6$ alkyl moiety, or a

$R_5$ is a $C_1$ to $C_6$ alkyl moiety; and $R_3$ and $R_4$ are independently hydrogen or a $C_1$ to $C_6$ alkyl moiety; and n is from 1 to 4.

10. The method of claim 9 wherein n is at least 2.

11. The method of claim 9 wherein the solvent comprises a lower alkyl ether alcohol.

12. The method of claim 11 wherein the solvent comprises 2-(2-ethoxyethoxy)ethanol.

13. The method of claim 9 wherein the solvent comprises an ether.

14. The method of claim 13 wherein the solvent comprises 2-methoxyethyl ether.

15. The method of claim 9 wherein the polyamic acid comprises a fluorinated polymer.

16. The method of claim 15 wherein the fluorinated polymer comprises the reaction product of 2,2-bis(3,4-dicarboxyphenyl)hexafluoropropane dianhydride and at least one diamine.

17. The method of claim 9 wherein steps (a) to (c) are repeated to provide successive layers of polyimide on the substrate.

18. A method of forming multiple layers of fluorine-containing polyimide on a substrate which comprises:
   (a) applying a first layer of fluorine-containing polyamic acid to the substrate;
   (b) partially imidizing the first layer of polyamic acid to provide a first polyimide layer;
   (c) applying a layer of polyamic acid over the first layer of polyimide wherein the polyamic acid is in a solvent of the formula

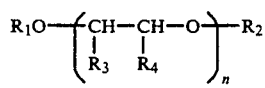

wherein $R_1$ and $R_2$ are independently a hydrogen, a $C_1$ to $C_6$ alkyl moiety, or a

$R_5$ is a $C_1$ to $C_6$ alkyl moiety; and $R_3$ and $R_4$ are independently hydrogen or a $C_1$ to $C_6$ alkyl moiety; and n is from 1 to 4; and (d) imidizing the polyamic acid.

19. The method of claim 18 wherein n is at least 2.

20. The method of claim 18 wherein the solvent comprises 2-methoxyethyl ether.

21. The method of claim 18 wherein the fluorinated polymer comprises the reaction product of 2,2-bis(3,4-dicarboxyphenyl)-hexafluoropropane dianhydride and at least one diamine.

22. The method of claim 18 wherein steps (a) to (d) are repeated to provide successive layers of polyimide on the substrate.

23. The method of claim 1 further including applying a patterned conductor layer between steps (b) and (c).

24. The method of claim 9 further including applying a patterned conductor layer between steps (b) and (c).

25. The method of claim 18 further including applying a patterned conductor layer between steps (b) and (c).

* * * * *

UNITED STATES PATENT AND TRADEMARK OFFICE
CERTIFICATE OF CORRECTION

PATENT NO. : 5,137,751
DATED : August 11, 1992
INVENTOR(S) : Marvin J. Burgess, et al It is certified that error appears in the above-indentified patent and that said Letters Patent is hereby corrected as shown below:

| Column | Line | |
|---|---|---|
| 1 | 66 | "greater than abort 150°C" should read --greater than about 150°C-- |
| 2 | 19 | "$R_1$ and $R_2$ independently" should read --$R_1$ and $R_2$ are independently-- |
| 5 | 27 | "dodecamettylene" should read --dodecamethylene-- |
| 5 | 62 | "(3,4-dicarboxyphenyl)etter" should read --(3,4-dicarboxyphenyl)ether-- |
| 14 | 41 | "(A?BP)" should read --(APBP)-- |

Signed and Sealed this

Fifth Day of October, 1993

Attest:

BRUCE LEHMAN

Attesting Officer     Commissioner of Patents and Trademarks